United States Patent [19]

Grupp

[11] Patent Number: 5,586,064
[45] Date of Patent: Dec. 17, 1996

[54] ACTIVE MAGNETIC FIELD COMPENSATION SYSTEM USING A SINGLE FILTER

[75] Inventor: Daniel Grupp, Brooklyn, N.Y.

[73] Assignee: The Trustees of the University of Pennsylvania, Philadelphia, Pa.

[21] Appl. No.: 333,737

[22] Filed: Nov. 3, 1994

[51] Int. Cl.$^6$ ........................................... H03H 3/00
[52] U.S. Cl. ............... 364/572; 364/571.01; 364/571.08; 324/225; 333/219.2; 361/143; 361/146
[58] Field of Search ............................ 324/225, 244–262; 33/355–357; 361/143–149; 364/571.01–571.07, 480; 333/219.2

[56] References Cited

U.S. PATENT DOCUMENTS

| | | | |
|---|---|---|---|
| 2,979,641 | 4/1961 | Gunthard et al. | 317/123 |
| 3,673,465 | 6/1972 | Tschopp | 317/123 |
| 3,801,877 | 4/1974 | Griese et al. | 317/157.5 |
| 4,058,782 | 11/1977 | Forster | 335/219 |
| 4,131,987 | 1/1979 | Pavlik | 333/73 OR |
| 4,622,843 | 11/1986 | Hormel | 73/1 |
| 4,677,403 | 6/1987 | Kich | 333/229 |
| 4,823,081 | 4/1989 | Geisler | 324/225 |
| 5,032,792 | 7/1991 | Wing et al. | 324/228 |
| 5,032,947 | 7/1991 | Li et al. | 361/143 |
| 5,225,999 | 7/1993 | Luzzi | 364/571.01 |

OTHER PUBLICATIONS

Description and Operating Guide for EMC MK IIA, E. L. F. Magnetic Field Compensation System; Linear Research Associates, Dec. 10, 1992.

Spicer Consulting, SC07, Magnetic Field Cancelling System, Product Literature.; Jun. 3, 1991.

Integrated Dynamics Engineering Inc. AC/DC Electromagnetic Interference (EMI) Compensation Systems for Precision Instrumentation and Equipment—Product Literature, Nov. 1, 1993.

"Computer–Controlled Method for Removal of Stray Magnetic Fields"; M. C. Buncick, H. H. Hubbell, Jr., R. D. Birkhoff, R. J. Warmack, and R. S. Becker; Rev. Sci. Instrum 54(1), Jan. 1983, American Institute of Physics.

"Application of AC Magnetic Field Compensation to a Scanning Electron Microscope"; A. Gemperle and J. Novak; Institute of Physics, Czechoslovak Academy of Sciences, Prague, Czechoslovakia; Journal of Physics E: Scientific Instruments 1976, vol. 9.

"Resolving Power of an Electron Microscope Equipped With Automatic Compensation of Transverse AC Magnetic Fields"; A. Gemperle, J. Novak and J. Kaczer; Journal of Physics E: Scientific Instruments 1974, vol. 7.

(List continued on next page.)

Primary Examiner—Emanuel T. Voeltz
Assistant Examiner—Kamini Shah
Attorney, Agent, or Firm—Woodcock Washburn Kurtz Mackiewicz & Norris

[57] ABSTRACT

The present invention provides a magnetic compensation system and a method of utilizing a magnetic compensation system to neutralize magnetic fields in an environment of a magnetically sensitive instrument. A magnetometer is used to sense magnetic field components in the environment and convert them into a signal. The signal is filtered to remove frequency components associated with the resonant frequency of the compensation system. The filtered signal is amplified by a signal amplifier and amplified by a power amplifier to generate current to drive a semi-Helmholtz coil disposed in the environment of the instrument. Magnetic fields are produced by the semi-Helmholtz coil which neutralize the sensed magnetic fields. The filter may be implemented using either a low-pass filter or a notch filter with notch frequencies set to the resonant frequency and harmonics thereof. The cut-off frequency of the low pass filter or the notch frequencies of the notch filter are selected so that the open loop gain of the compensation system is less than about 1 at the resonant frequency. The compensation system components are selected to maximize the resonant frequency and reduce circuit delay.

25 Claims, 3 Drawing Sheets

OTHER PUBLICATIONS

"The Application of Fluxgate Magnetometer to an Automatic Electronic Degaussing System," R. L. Graham and J. S. Geiger, *Canadian Journal of Physics*, vol. 39, 1961, pp. 1357–1368.

"A Versatile Apparatus for Neutralizing Stray Magnetic Fields of ac Origin," G. Hadley, R. Hart and J. Yoshiyama, *The Review of Scientific Instruments*, vol 43, No. 3, pp. 542–544.

"A Servo System for Reducing Stray AC Magnetic Fields in an Iron–Free Environment," J. W. Hand, *Journal of Physics E: Scientific Instruments*, vol. 9, Great Britian, 1976.

"Design of a Room–Size Magnetic Shield," B. Patton and J. Fitch, *Journal of Geophysical Research*, vol. 67, No. 3, Mar. 1962, pp. 1117–1121.

"The Fluxgate Magnetometer," *Journal of Physics E: Scientific Instruments*, vol. 12, Great Britain, 1979.

Kernevez et al., "Week field NMR and ESR Spectrometers and Magnometers"; IEEE Transactions on Magnetics, vol. 28, No. 5, pp. 3054–3059.

ACTIVE MAGNETIC FIELD COMPENSATION SYSTEM USING A SINGLE FILTER

FIELD OF THE INVENTION

The present invention relates generally to the control of magnetic fields and, more particularly, to the effective control of magnetic fields in the environment of a magnetically sensitive instrument.

BACKGROUND OF THE INVENTION

Effective operation of magnetically sensitive instruments, such as electron microscopes and magnetically sensitive circuitry used in metrological applications, require a stable magnetic operational environment. Magnetic field instabilities pose a significant problem to the operational effectiveness of these magnetically sensitive instruments. In some cases, the magnetic instabilities may produce uncertainty in the operating parameters of these instruments or, alternatively, they may tend to prevent reasonable results from being obtained. For example, in the case of an electron microscope, the image being analyzed may be degraded by magnetic instabilities.

Generally, a magnetically sensitive instrument is operated within a given magnetic environment. Such environments may contain DC field components (e.g., the earth's magnetic field); slowly wandering DC field components (e.g., those resulting from nearby elevators or subways); and AC field components (e.g., those caused by power sources or grounding problems). These frequency components may be oriented in a vertical or horizontal direction with respect to the magnetically sensitive instrument and may require neutralization to effectively operate the instrument. Thus, compensation systems have been required for use with magnetically sensitive instruments to control the magnetic fields within the instrument's operational environment.

A typical compensation system generally comprises several components. A magnetic sensor is disposed proximate to the instrument. The sensor senses the magnetic fields in the instrument's operational environment. A filter bank or processor extracts field components having frequencies corresponding to those magnetic fields intended for neutralization. The output of the filter bank or processor is provided to an amplifier for generating a sufficient current to drive a compensation coil to produce neutralizing magnetic fields. The compensation coil produces magnetic fields substantially equal in magnitude and opposite in direction to the sensed magnetic fields to effectively neutralize the magnetic field components intended for neutralization.

Previous compensation systems were generally incapable of compensating for both DC and AC field components. For instance, Buncick (1982), provided a compensation system with a very slow response time. It was only capable of stabilizing DC field components. Whereas, Gemperle and Novak (1976), Gemperle, et al. (1974), and Hadley, et al. (1971), developed compensation systems only capable of detecting AC magnetic fields and, therefore, only compensated for AC frequency components. Compensation for both AC and DC magnetic field instabilities was provided by Hand (1976), but such result was accomplished only by simultaneously using two compensation systems.

More recently, compensation systems have taken advantage of the capability of fluxgate magnetometers for detecting both DC and AC magnetic field components in a particular environment. These compensation systems are, therefore, capable of compensating for both AC and DC frequency components in the same system. However, such compensation systems require dedicated hardware in the form of tuned filter-amplifier pairs in which each filter-amplifier pair must be tuned to a particular frequency component present in the magnetic environment. (See Luzzi, U.S. Pat. No 5,225, 999, issued on Jul. 6 1993) Such tuning requires the relevant magnetic environment to be evaluated to determine which frequency components are significant in terms of the instrument's operational performance. After identifying significant field components, the number of filters-amplifier pairs required by the compensation system is determined and the band-pass frequencies of those filters can be preselected.

The disadvantages of such systems are apparent when the number of significant field components to be neutralized is large. For example, the expense and complexity of the system increases with the number of components. The phase delay associated with each separate filter-amplifier pair requires a separate timing adjustment to ensure that the neutralizing magnetic field is produced with an accurate phase to effectively neutralize the sensed magnetic field.

Additionally, each environment requires careful advance analysis to determine significant field components. However, the significant field components may vary over time and may differ depending upon each instrument's particular sensitivity. Thus, once a system is designed for a particular instrument to be operated in a specific environment, it may not be operable for other instruments or when changes occur in the operational environment. Moreover, such systems are incapable of compensating for broadband disturbances caused, for example, by switching motors on or off, since the occurrence and characteristics of such broadband disturbances are random.

Other compensation systems have addressed some of these problems by implementing the signal analysis components in software. For example, Integrated Dynamics Engineering, Inc. (ADA) located in Woburn, Mass., has developed a compensation system using a digital signal processor (DSP) instead of a plurality of filter-amplifier pairs. The DSP is pre-programmed with data identifying the significant field components present in the instrument's operational environment that are to be neutralized. These compensation systems can be adaptively modified for use with different instruments and may be easily modified in response to changes in the instrument's operational environment. However, the ADA system still requires a costly signal processor and an a priori analysis of the operating environment to appropriately pre-program the DSP. Thus, the ADA system compensation is limited to only two frequencies and four harmonics.

Many available compensation systems utilize a Helmholtz coil or a semi-Helmholtz coil (e.g., each of the two loops of the Helmholtz coil may be non-circular) to serve as the compensation coil. Typically, each coil loop is placed around the perimeter of a room in which the instrument is to be used. To compensate for vertical magnetic fields, one of the coil loops is located near the floor of the room and the other coil loop is located near the ceiling so that the instrument can be disposed within the Helmholtz coil. Similarly, to compensate for horizontal magnetic fields, each coil loop of the Helmholtz coil is located near opposite walls of the room.

The coil loops used in compensation systems generally comprise a number of turns of wire. However, each additional turn adds inductance to the system thereby increasing the circuit delay, the system expense and complexity.

Therefore, there exists a need for a simple and cost-effective magnetic compensation system to be used during the operation of a magnetically sensitive instrument which is sufficiently adaptable for neutralizing both DC and broadband AC magnetic field components independent of changes in the operating environment of the magnetically sensitive instrument and independent of the type of magnetically sensitive instrument to be operated.

SUMMARY OF THE INVENTION

The present invention fulfills this need by providing a magnetic compensation system including a sensor for sensing magnetic fields in an environment of the magnetically sensitive instrument, a transducer means coupled to the sensor for generating a signal having frequency components associated with the magnetic fields sensed by the sensor, a filter coupled to an output of the transducer means for filtering the signal to substantially eliminate frequency components associated with the resonant frequency to define a compensating signal, and a compensation coil disposed in the environment of the magnetically sensitive instrument to produce neutralizing magnetic fields based on the compensating signal to effectively neutralize the sensed magnetic fields.

The filter according to the invention is preferably an analog filter. In one embodiment, the filter is a low-pass filter with a cut-off frequency selected so that the open loop gain of the compensation system is less than about 1 at the resonant frequency, but no more than 1. In another embodiment, the filter is a notch filter having notch frequencies defined to correspond to the resonant frequency and one or more harmonics thereof. The open loop gain of the compensation system at the notch frequencies should also be less than about 1.

Preferably, a power amplifier is coupled between the output of the filter and the compensation coil for amplifying the compensating signal to generate current for driving the compensation coil. A signal amplifier may also be coupled between the output of the filter and the power amplifier for amplifying the gain of the compensating signal. In a preferred embodiment, the sensor, transducer means, filter, amplifiers, and compensation coil are designed to substantially maximize the resonant frequency.

In a further preferred embodiment, the compensation coil is a semi-Helmholtz coil and has approximately 1 turn in each coil loop.

The sensed magnetic fields comprise both DC and AC frequency components. According to a preferred embodiment, the neutralizing magnetic fields neutralize the sensed magnetic fields by attenuating the DC frequency components by at least about −80 dB and by attenuating the AC frequency components at about 60 Hz by at least about −35 dB.

A method of utilizing a magnetic compensation system to neutralize magnetic fields in an environment of a magnetically sensitive instrument is also provided by the invention. According to the invention, magnetic fields are sensed in the environment of the magnetically sensitive instrument. A signal is generated based on the sensed magnetic fields. The signal is then filtered to substantially eliminate frequency components associated with the resonant frequency to define a compensating signal. Neutralizing magnetic fields are produced in the environment based on the compensating signal to effectively neutralize the sensed magnetic fields.

Preferably, the resonant frequency of the magnetic compensation system is maximized and the sensed magnetic fields are effectively neutralized substantially in real-time.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION OF THE INVENTION

Figure 1:
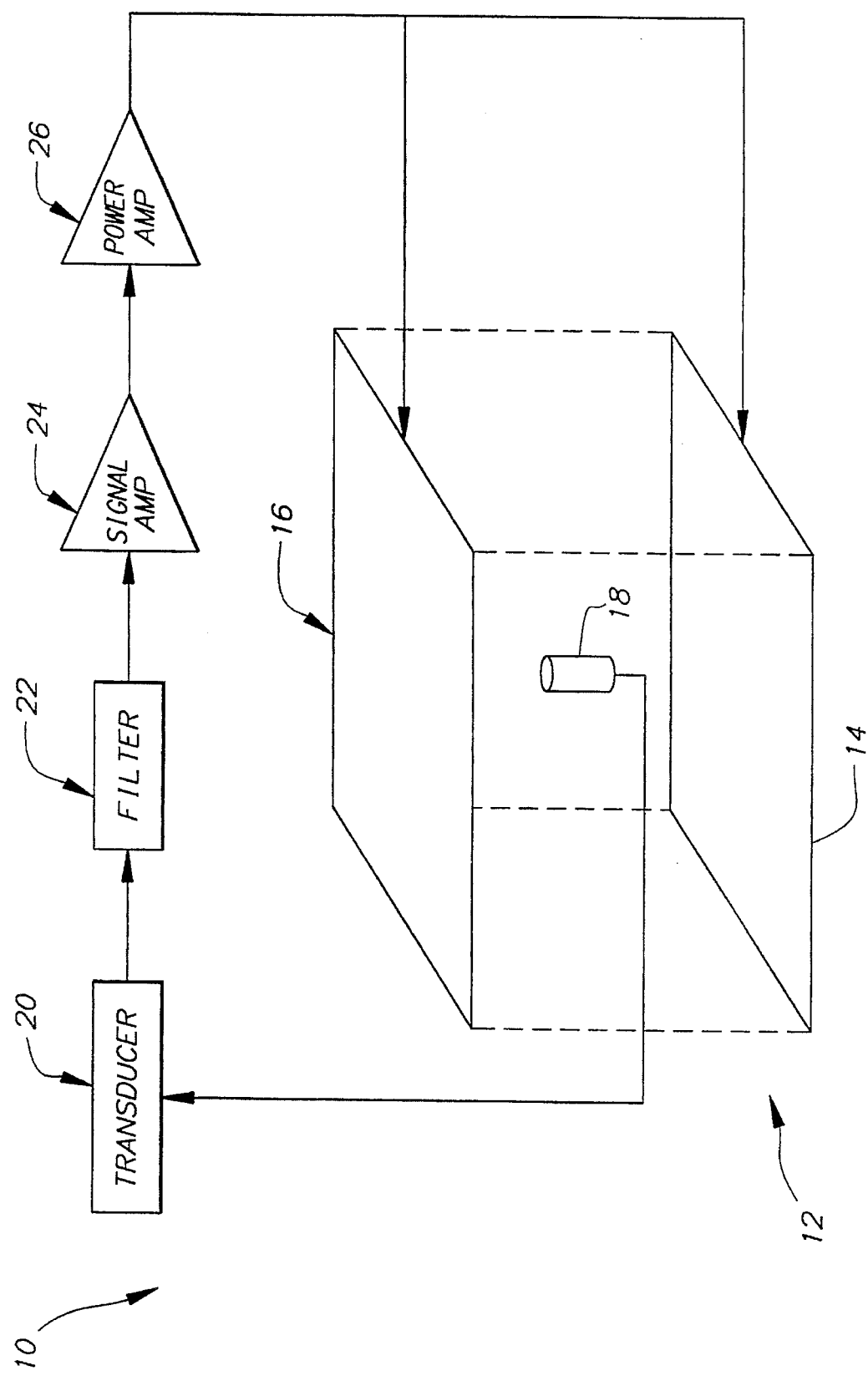
FIG. 1 shows a block diagram of a compensation system according to the invention.

A block diagram of a compensation system according to the invention is shown generally at 10 in FIG. 1. A compensation coil 12 is preferably disposed in the environment of the magnetically sensitive instrument, e.g., the room in which the instrument is operated. In a preferred embodiment, the compensation coil is a semi-Helmholtz coil having a first coil loop 14 tracking the perimeter of the room near the floor and a second coil loop 16 tracking the perimeter of the room near the ceiling. Alternatively, the two coil loops 14 and 16 may be of a smaller perimetrical dimension and be disposed to more closely surround the magnetically sensitive instrument.

A sensor or probe 18 is disposed proximate the instrument (not shown) which is preferably located between the first and second coil loops 14 and 16, respectively. The sensor 18 senses magnetic fields in the environment in which it is disposed and a magnetic transducer 20 coupled to the sensor generates an analog signal having frequency components corresponding to the frequency components of the sensed magnetic fields. In a preferred embodiment, a fluxgate magnetometer is used to sense the magnetic fields and to generate the signal.

A filter 22 is coupled to the output of the magnetic transducer 20. The filter is designed to eliminate substantially any frequency components present in the signal associated with the resonant frequency ($f_{res}$) of the compensation system. The resonant frequency shall be defined herein as the reciprocal of the time required for a signal to travel the circuit formed by the compensation system. Therefore, an object of the invention is to maximize $f_{res}$ in an effort to simplify the filter design without sacrificing the system's ability to compensate higher frequency magnetic fields.

Figure 2:
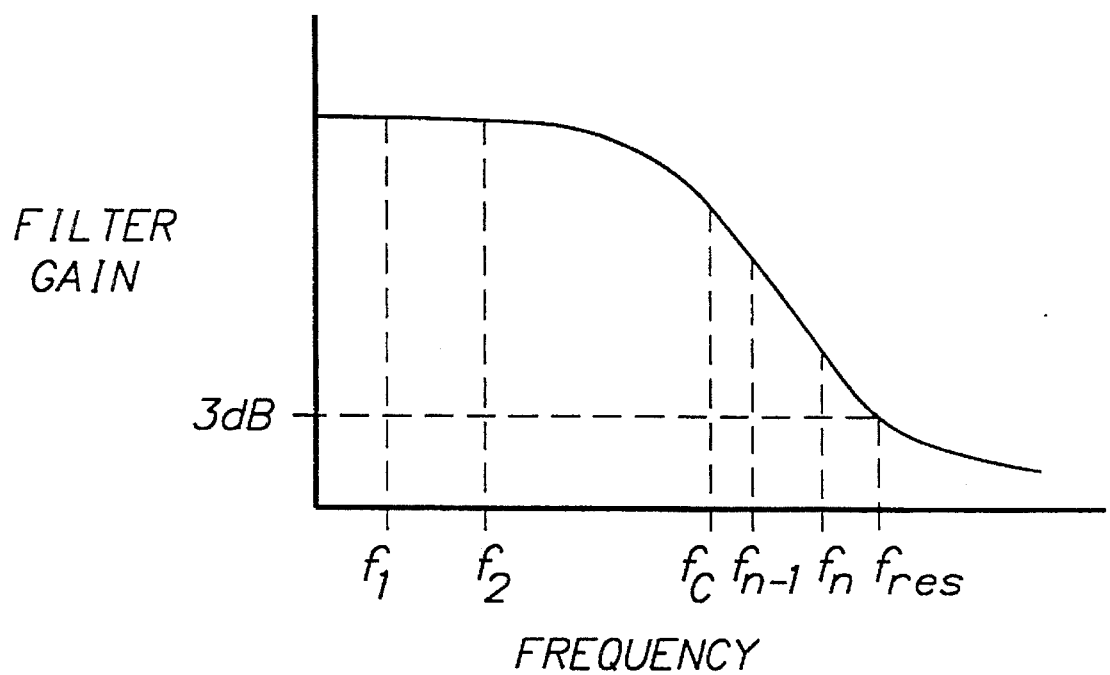
FIG. 2 shows the gain characteristics of a low-pass filter used in the compensation system according to the invention.

For example, a low-pass filter having gain characteristics shown in FIG. 2 may be used in the compensation system according to the invention. In particular, the cut-off frequency ($f_c$) of the low-pass filter may be selected so that the open loop gain of the compensation system ($G_{OL}$) at $f_{res}$ is less than 1:

$$G_{OL}(f_{res}) < 1,$$

where $G_{OL}$ is the product of the gain of each component included in the compensation system shown in FIG. 1. So long as $f_{res}$ is sufficiently higher than any magnetic field components present in the environment (i.e., $f_1, f_2, \ldots f_{n-1}, f_n$) requiring neutralization for the instrument to effectively operate, all of these significant field components will be passed by a filter with the characteristics shown in FIG. 2.

Preferably, $f_{res}$ is several times greater than the highest significant frequency, i.e., the highest frequency associated with the magnetic field components requiring neutralization. It has been found that the highest significant frequency is generally about 180 Hz. Therefore, in a preferred embodiment, $f_{res}$ should be at least about 500 Hz and, more preferably, greater than about 1000 Hz.

The criteria set forth above for selecting $f_c$ is a somewhat flexible standard. It should be understood that a lower $f_c$ may be selected to optimize DC magnetic field component compensation or a higher $f_c$ may be selected to increase the compensation system's broadband capability. However, it should be further understood the magnetic field components having frequencies greater than $f_c$ may be compensated for by the compensation system, e.g., $f_{-1}$ and $f_n$ shown in FIG. 2.

Figure 3:
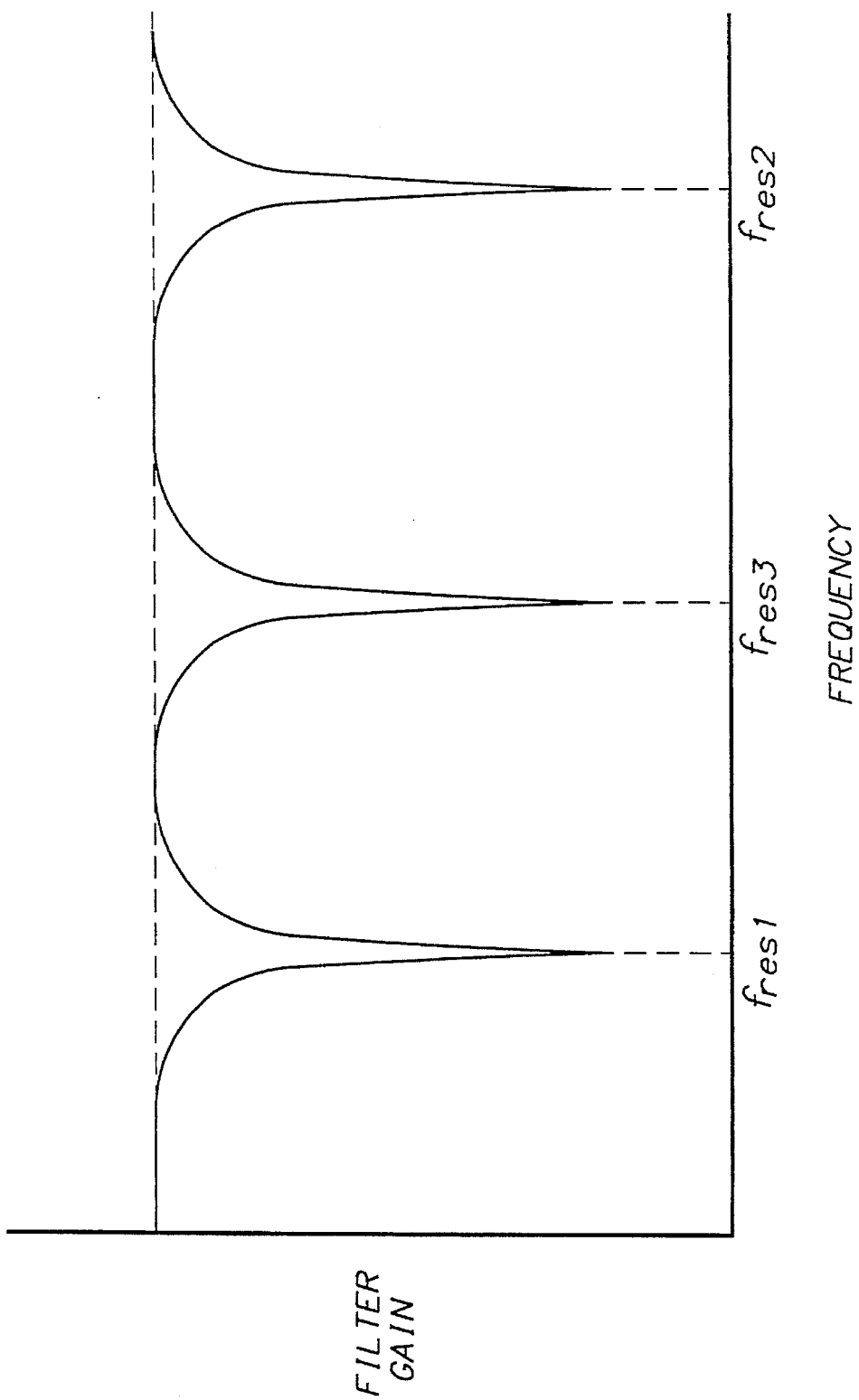
FIG. 3 shows the gain characteristics of a notch filter used in the compensation system according to the invention.

Alternatively, a notch filter having the gain characteristics shown in FIG. 3 may be used in the compensation system of the present invention. As shown in the figure, the notch frequencies may be set to correspond to $f_{res}$ ($f_{res}$) and one or more harmonics thereof ($f_{res2}$, $f_{res3}$, . . .). Thus, substantially all frequencies are passed except those associated with $f_{res}$. While the notch filter may be more complicated to set than the low-pass filter described above, it may provide improved broadband performance. If a notch filter is used, the notch frequencies are selected so that the open loop gain ($G_{OL}$) Of the compensation system is less than about 1:

$$G_{OL}(F_{notch}=f_{res1}, f_{res2}, f_{res3}, \ldots)<1.$$

Returning to FIG. 1, a signal amplifier 24 is connected to the output of filter 22. The signal amplifier 24 amplifies the signal gain thereby introducing an additional source of gain in the compensation system. A power amplifier 26 is connected to the output of the signal amplifier 24 and is used to generate the current for driving the compensation coil 12.

As described above, an objective of the present invention is to maximize $f_{res}$. Accordingly, it is desirable to minimize the circuit delay of the compensation system. Thus, the components used in the compensation system should be selected or designed with minimal circuit delay so that $f_{res}$ is substantially maximized. In a preferred embodiment, the magnetometer is capable of detecting frequency components up to at least about 2 KHz. Although it is not necessary usually to compensate for frequency components with such high frequencies, the delay introduced by the magnetometer decreases as its frequency range increases. Additionally, only a single filter, either a low-pass or notch filter is used in the system to minimize the circuit delay. Moreover, the selected filter preferably provides a substantially maximal cut-off frequency or notch frequency, respectively, to further minimize the delay introduced by the filter. In a preferred embodiment the filter is analog. However, a digital filter having the characteristics described herein may also be used in the invention.

A high-gain signal amplifier, such as a PAR 113 or SRS 560 commercially available from Princeton Applied Research or Stanford Research Systems, respectively, is also used in a preferred embodiment. Similarly, the power amplifier used should be a bipolar amplifier capable of driving required currents through a low-impedance load (e.g., about 1–Ω) with minimal delay from input to output. Such a power amplifier is available from Kepco. Moreover, according to a preferred embodiment, each coil 14 and 16 of the compensation coil 12 comprises only a single turn to further minimize the delay. Thus, the power amplifier drives a small load, e.g. approximately 1Ω, introduced by the single-turn coil loops.

A compensation system designed as described herein using either a low-pass filter with gain characteristics as shown in FIG. 2 or a notch filter with gain characteristics as shown in FIG. 3, is capable of compensating for both DC and broadband AC components in one system. The DC frequency components are effectively reduced by at least about −80 dB by this embodiment of the invention. AC frequency components at about 60 Hz are effectively reduced by at least about −35 dB by the compensation system using the low-pass filter described herein. It should be understood that magnetic field components having frequencies other than 60 Hz are also attenuated depending on the filter characteristics, and that, the value at 60 Hz is used for exemplary purposes only. Moreover, even those magnetic field components having frequencies of $f_{n-1}$ and $f_n$ that are greater than $f_c$ as shown in FIG. 2 can be reduced by more than about −35 dB. However, it should be understood that the amount of broadband compensation varies with the filter gain characteristics.

The design and implementation of the compensation system are dependent upon $f_{res}$. However, no analysis of the operational environment is needed to design and implement a compensation system according to the invention. In contrast, many compensation systems disclosed by the prior art require advance analysis of the operational environment upon which the system design is based. One advantage of the invention is that once $f_{res}$ has been determined and the compensation system is designed as described above, there is no need to alter the compensation system for use with different instruments or for use in different operational environments.

While the invention has been described and illustrated with reference to specific embodiments, those skilled in the art will recognize that modification and 1.0 variations may be made without departing from the principles of the invention as described hereinabove and set forth in the following claims.

What is claimed:

1. A magnetic compensation system having a predetermined resonant frequency and being adapted for use with a magnetically sensitive instrument comprising:

a sensor for sensing magnetic fields in an environment of said magnetically sensitive instrument;

a transducer means coupled to said sensor for generating a signal having frequency components associated with said magnetic fields sensed by said sensor;

a filter coupled to an output of said transducer means for filtering said signal to substantially eliminate frequency components associated with said resonant frequency to define a compensating signal; and a compensation coil disposed in the environment of said magnetically sensitive instrument and being operatively coupled to an output of said filter, said compensation coil producing neutralizing magnetic fields based on said compensating signal to effectively neutralize said sensed magnetic fields.

2. The system of claim 1, wherein said filter is a low-pass filter.

3. The system of claim 2, wherein said filter has a cut-off frequency selected so that the open loop gain of the compensation system is less than about 1 at said resonant frequency.

4. The system of claim 1, wherein said filter is a notch filter.

5. The system of claim 4, wherein said filter is a notch filter having notch frequencies defined to correspond to said resonant frequencies and further comprises one or more notch frequency corresponding to harmonics of said resonant frequency thereof.

6. The system of claim 5, wherein the open loop gain of the compensation system is less than about 1 at the notch frequencies.

7. The system of claim 1, wherein said sensor, transducer means, filter, and compensation coil are designed to substantially maximize said resonant frequency.

8. The system of claim 1, wherein said compensation coil is a semi-Helmholtz coil having approximately 1 turn in each coil loop.

9. The system of claim 1, further comprising: a power amplifier coupled between the output of said filter and said compensation coil for amplifying the compensating signal to generate current for driving said compensation coil.

10. The system of claim 9, further comprising: a signal amplifier coupled between the output of said filter and said power amplifier for amplifying the gain of the compensating signal.

11. The system of claim 9, wherein said filter is a low-pass filter having a cut-off frequency which is less than the frequency associated with at least one of the sensed magnetic fields.

12. The system of claim 1, wherein said transducer means and said sensor are implemented by a fluxgate magnetometer.

13. The system of claim 1, wherein said sensed magnetic fields comprise both DC and AC frequency components, said neutralizing magnetic fields neutralizing said sensed magnetic fields by attenuating said DC frequency components by at least about −80 dB and by attenuating said AC frequency components at about 60 Hz by at least about −35 dB.

14. A method of utilizing a magnetic compensation system having a predetermined resonant frequency to neutralize magnetic fields in an environment of a magnetically sensitive instrument, comprising the steps of:

sensing magnetic fields in the environment of said magnetically sensitive instrument;

generating a signal based on said sensed magnetic fields;

filtering said signal to substantially eliminate frequency components associated with said resonant frequency to define a compensating signal; and producing neutralizing magnetic fields in said environment based on said compensating signal to effectively neutralize said sensed magnetic fields.

15. The method of claim 14, further comprising the step of maximizing the resonant frequency of said magnetic compensation system.

16. The method of claim 14, wherein said sensed magnetic fields are effectively neutralized substantially in real-time.

17. The method of claim 14, wherein the step of filtering said signal comprises the step of defining a cut-off frequency of a low-pass filter such that the open loop gain of the compensation system is less than about 1 at said resonant frequency.

18. The method of claim 17, wherein said cut-off frequency is less than the frequency associated with at least one of the sensed magnetic fields.

19. The method of claim 14, wherein the step of filtering the signal comprises the step of defining notch frequencies of a notch filter to correspond to said resonant frequencies and further comprises one or more notch frequency corresponding to harmonics of said resonant frequency thereof.

20. The method of claim 19, wherein the open loop gain of the compensation system is less than about 1 at the notch frequencies.

21. The method of claim 14, wherein said sensed magnetic fields comprise both DC and AC frequency components and said step of neutralizing said sensed magnetic fields comprising the steps of:

attenuating said DC frequency components by at least about ±80 dB; and attenuating said AC frequency components at about 60 Hz by at least about −35 dB.

22. A magnetic compensation system having a predetermined resonant frequency and being adapted for use with a magnetically sensitive instrument comprising:

a sensor for sensing magnetic fields in an environment of said magnetically sensitive instrument;

a transducer means coupled to said sensor for generating a signal having frequency components associated with said magnetic fields so sensed;

a filter coupled to an output of said transducer means for filtering said signal to substantially eliminate frequency components associated with said resonant frequency to define a compensating signal;

a compensation coil disposed in the environment of said magnetically sensitive instrument and being operatively coupled to said filter, said compensation coil producing neutralizing magnetic fields based on said compensating signal to effectively neutralize said magnetic fields so sensed; and said sensor, transducer means, filter, and compensation coil being designed to substantially maximize said resonant frequency and minimize circuit delay of said compensation system.

23. The system of claim 22, wherein said filter is a low-pass filter having a cut-off frequency selected so that the open loop gain of the compensation system is less than about 1 at said resonant frequency.

24. The system of claim 22, wherein said filter is a notch filter having notch frequencies defined corresponding to said frequencies and further comprises one or more notch frequency corresponding to harmonics of said resonant frequency thereof.

25. The system of claim 24, wherein said compensation coil is a semi-Helmholtz coil having approximately 1 turn in each coil.

* * * * *

UNITED STATES PATENT AND TRADEMARK OFFICE
CERTIFICATE OF CORRECTION

PATENT NO. : 5,586,064
DATED : December 17, 1996
INVENTOR(S) : Daniel Grupp

It is certified that error appears in the above-indentified patent and that said Letters Patent is hereby corrected as shown below:

Col. 5, line 14, "$f_{-n}$" should be --$f_{n-1}$--

Signed and Sealed this

Third Day of June, 1997

Attest:

BRUCE LEHMAN

Attesting Officer

Commissioner of Patents and Trademarks